United States Patent
Simas et al.

(10) Patent No.: US 7,092,899 B2
(45) Date of Patent: Aug. 15, 2006

(54) METHOD AND SYSTEM FOR GENERATING A BRICK MODEL

(75) Inventors: Angie Simas, San Rafael, CA (US); Peter Frank Andersen, Vejle Oest (DK); Dennis Leahy, Fairfield, CT (US); Ian Meredith, Oxon (GB)

(73) Assignee: Interlego AG, (CH)

( * ) Notice: Subject to any disclaimer, the term of this patent is extended or adjusted under 35 U.S.C. 154(b) by 579 days.

(21) Appl. No.: 09/702,515

(22) Filed: Oct. 31, 2000

(65) Prior Publication Data

US 2003/0132966 A1   Jul. 17, 2003

(51) Int. Cl.
 *G06G 30/00* (2006.01)
(52) U.S. Cl. ..................... 705/26; 273/153 R
(58) Field of Classification Search ............... 434/434, 434/92; 705/26, 27; 273/153 R
See application file for complete search history.

(56) References Cited

U.S. PATENT DOCUMENTS

| | | | | |
|---|---|---|---|---|
| 5,009,626 A | * | 4/1991 | Katz ......................... | 446/391 |
| 5,605,332 A | * | 2/1997 | Harnett ................... | 273/157 R |
| 5,975,908 A | * | 11/1999 | Hulten ...................... | 434/72 |
| 6,249,600 B1 | * | 6/2001 | Reed et al. ................ | 382/154 |
| 6,256,719 B1 | * | 7/2001 | Frankel ...................... | 712/11 |
| 6,526,375 B1 | * | 2/2003 | Frankel et al. ............. | 703/21 |
| 6,741,245 B1 | * | 5/2004 | Marks et al. ............... | 345/420 |

FOREIGN PATENT DOCUMENTS

EP   0696464 A1 *  2/1996

OTHER PUBLICATIONS

Lugnut.com; Mosaic Maker; www.lugnut.com/cad/mosaic; 1 page; date unknown.
Toybuilders.com; "Action Figures"; www.toybuilders.com/Young/action_figures.htm; 3 pages; date unknown.
Toybuilders.com; Building your 3D Creations; www.toybuilders.com/building_your_3d_creations.htm; 2 pages; date unknown.

* cited by examiner

*Primary Examiner*—Jeffrey A. Smith
*Assistant Examiner*—Jaime E. Zurita
(74) *Attorney, Agent, or Firm*—Cantor Colburn LLP

(57) ABSTRACT

An exemplary embodiment is a method for generating a brick model. The method includes receiving an electronic representation of an item to be represented by the brick model. The electronic representation is processed to generate building instructions for building the brick model and connected to an order interface for enabling the user to order bricks to make a model for shipment to the user.

42 Claims, 11 Drawing Sheets

US 7,092,899 B2

METHOD AND SYSTEM FOR GENERATING A BRICK MODEL

BACKGROUND OF THE INVENTION

The invention relates to a method and system for generating a brick model. Currently, brick models, such as those sold by the LEGO Group ("LEGO"), are sold to consumers in a number of ways. A consumer typically reviews a description of a brick model (e.g., the packaging for the brick model, a catalog, an e-catalog, an in-store display, etc.) to determine whether the consumer will purchase a brick model. The model may correspond to any item created by bricks. In general, consumers either select a model or models from sets of models defined by the manufacturer or generate their own creative models. The manufacturer's models typically are accompanied by instructions for assembling the model. While the current approach to distributing models is well accepted, the consumer is limited to either purchasing and assembling predefined models generated by a model designer who works for a manufacturer or designing their own models out of materials they have purchased, without assistance from the model designer. Thus, a system for assisting a consumer in generating custom models which may be purchased from a manufacturer is needed.

SUMMARY OF THE INVENTION

An exemplary embodiment is a method for generating a brick model. The method includes receiving an electronic representation of an item to be represented in bricks. The electronic representation is then processed to generate building instructions for building the brick model.

DETAILED DESCRIPTION OF THE PREFERRED EMBODIMENT

Figure 1:
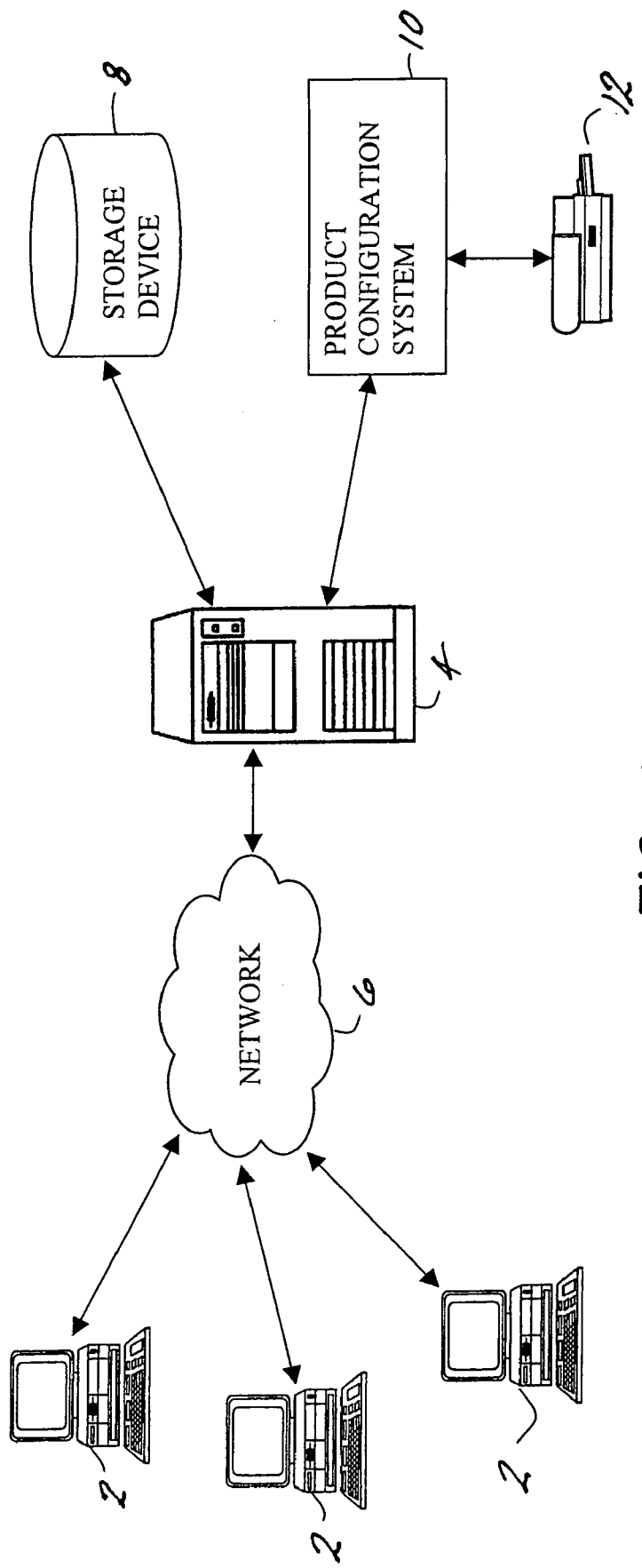
FIG. 1 is a block diagram of an exemplary system for generating a brick model.

FIG. 1 is a block diagram of an exemplary system for generating a brick model. A brick may be any discrete building item such as a plastic toy building element available from LEGO. Such toy building elements include coupling studs for frictionally interconnecting the toy building elements. The system of FIG. 1 includes user systems 2 through which a consumer will contact a host system 4. Preferably, the host system 4 executes a program that generates an electronic brick model, building instructions, etc. The user systems 2 are coupled to a host system 4 via a network 6. Each user system 2 may be implemented using a general-purpose computer executing a computer program for carrying out the processes described herein. The user systems 2 may be personal computers owned by consumers or computers placed in consumer locations such as toy stores, theme parks, etc. The processing described herein may be shared by user system 2 and host system 4 by providing an applet to the user system 2.

The network 6 may be any type of known network including a local area network (LAN), wide area network (WAN), global network (e.g., Internet), intranet, etc. The user system 2 may be coupled to the host system 4 through multiple networks (e.g., intranet and Internet) so that not all user systems 2 are coupled to the host system 4 via the same network. One or both of the user systems 2 and the host system 4 may be connected to the network 6 in a wireless fashion and network 6 may be a wireless network. In a preferred embodiment, the network 6 is the Internet and each user system 2 executes a user interface application (e.g., web browser) to contact the host system 4 through the network 6. Alternatively, a user system 2 may be implemented using a device programmed primarily for accessing network 6 such as WebTV.

The host system 4 may be implemented using a server operating in response to a computer program stored in a storage medium accessible by the server. The host system 4 may operate as a network server (often referred to as a web server) to communicate with the user systems 2. The host system 4 handles sending and receiving information to and from customer service workstations 2 and can perform associated tasks. The host system 4 may also include a firewall to prevent unauthorized access to the host system 4 and enforce any limitations on authorized access. For instance, an administrator may have access to the entire system and have authority to modify portions of the system. The firewall may be implemented using conventional hardware and/or software as is known in the art.

The host system 4 also operates as an applications server. The host system 4 executes one or more computer programs to generate the building instructions for the brick model. Processing may be shared by the user system 2 and the host system 4 by providing an application (e.g., java applet) to the user system 2. Alternatively, the user system can include a stand-alone software application for performing a portion of the processing described herein. The host system also interacts with a product configuration system 10 that generates the physical model sent to a consumer. The system includes a printer 12 that generates printed building instructions that accompany components of the physical model as described herein. It is understood that separate servers may be used to implement the network server functions and the applications server functions. Alternatively, the network server, firewall and the applications server can be implemented by a single server executing computer programs to perform the requisite functions.

Storage device 8 may be implemented using a variety of devices for storing electronic information such as a file transfer protocol (FTP) server. It is understood that storage device 8 may be implemented using memory contained in host system 4 or may be a separate physical device. Storage device 8 contains a variety of information including images submitted from user systems, electronic brick models derived from the images and building instructions for electronic brick models, each of which are described herein. Storage device 8 may also include a gallery of images from which the user can select an image for conversion to a brick model. Storage device 8 may also contain information concerning the submission of the image (e.g., a user identifier, order identifier, date and time of submission, etc.). In addition, information concerning the delivery of the brick model and instructions to the user (e.g., brick counts, delivery date and time, shipping address, etc.) may be stored in storage device 8.

Figure 2:
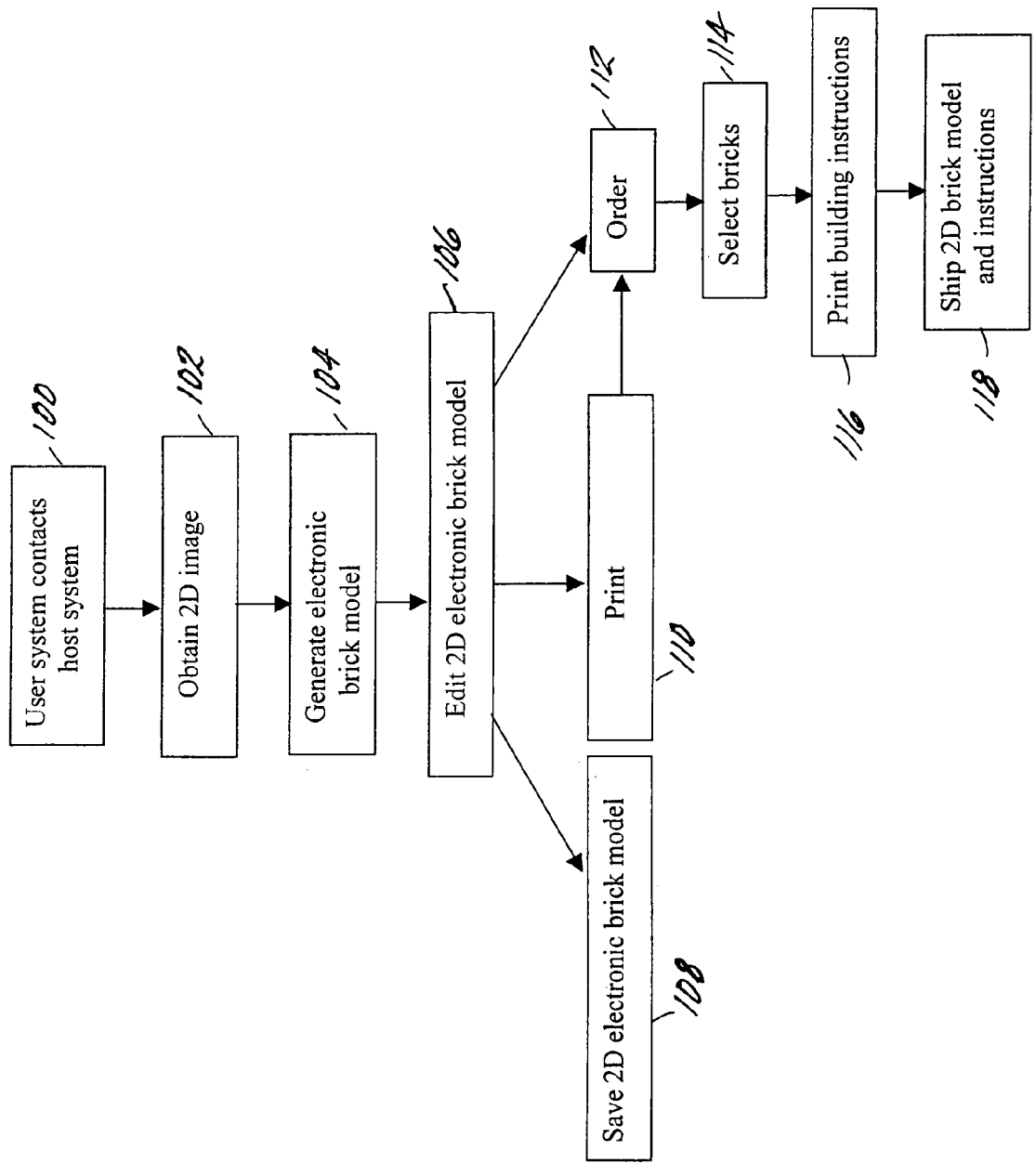
FIG. 2 is a flowchart of an exemplary process for generating a brick model.
Figure 10:
FIG. 10 depicts an exemplary gallery of images.

Operation of the system will now be described with reference to FIGS. 2–7. FIG. 2 is a flowchart of a process for generating a two-dimensional brick model in one embodiment. To generate a two-dimensional brick model, a two-dimensional image is used to define the item to be represented by the brick model. The process begins at 100 when a user system 2 contacts the host system 4. As described above, this may occur through the user system 2 contacting host system 4 using a web browser. The host system 4 may require the user to log in by providing a user name and password as known in the art. Once the user is logged in, the user is prompted at step 102 to define a two-dimensional image to be converted to a brick model. The image may be an image stored on the user system 2 that is then uploaded to the host system 4. Alternatively, the user can select an image from a gallery of images accessible by host system 4. For example, storage device 8 may contain a gallery of images. FIG. 10 depicts an exemplary gallery of images from which the user can select an image to be converted to a brick model. The gallery of images may be arranged by categories such as animals, buildings, etc. The host system 4 can process images in numerous formats including gif, jpg, bmp, etc. The host system 4 can also process files saved from a video device such as a digital camcorder. The image may also be generated through an input device associated with the user system such as a PC camera or scanner. For example, a user system 2 in the form of a kiosk at a theme park may include a digital camera for obtaining the image. The image is then transferred to host system 4.

Once the image is transferred to the host system 4, the host system 4 generates an electronic brick model at step 104. The electronic brick model is derived by dividing the image into a plurality of brick elements and determining a display parameter for each brick element. Brick elements in the electronic brick model are analogous to picture elements (or pixels) in the image. Each brick element defines a region in the electronic brick model and is assigned a brick element display parameter. The brick element display parameter is derived from the corresponding pixels in the image. For example, a brick element may correspond to a 3×3 array of pixels. The pixel display values (gray scale intensity, RGB values, etc.) may be combined to generate a brick element display parameter. For example, the gray scale intensities of the nine pixels in a 3×3 array may be averaged and the average compared to thresholds to determine the appropriate brick element display parameter. For color images, the combined pixel display values are mapped to a color space to find a brick element display parameter. The size of each brick element corresponds to an actual brick. The brick element display parameter corresponds to the color of an actual brick that will be provided in the brick model. For example, in one embodiment the electronic brick model is a gray scale representation made up of five types of bricks, namely black, dark gray, medium gray, light gray and white. Once the image is received, pixel regions corresponding to each brick element are converted to one of these five brick tones using techniques described above.

Figure 3:
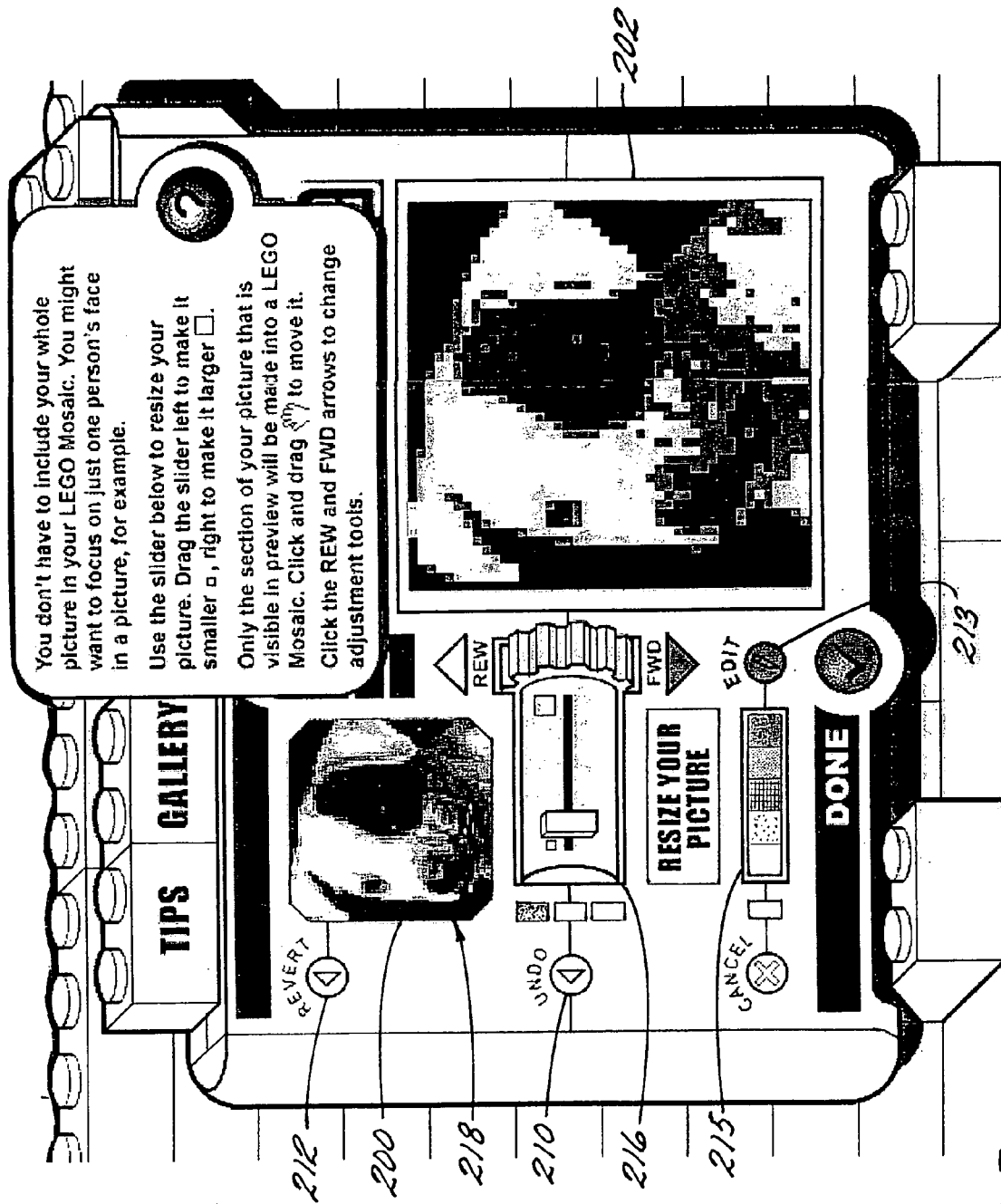
FIGS. 3–7 depict exemplary user interfaces for generating an electronic brick model.
Figure 4:
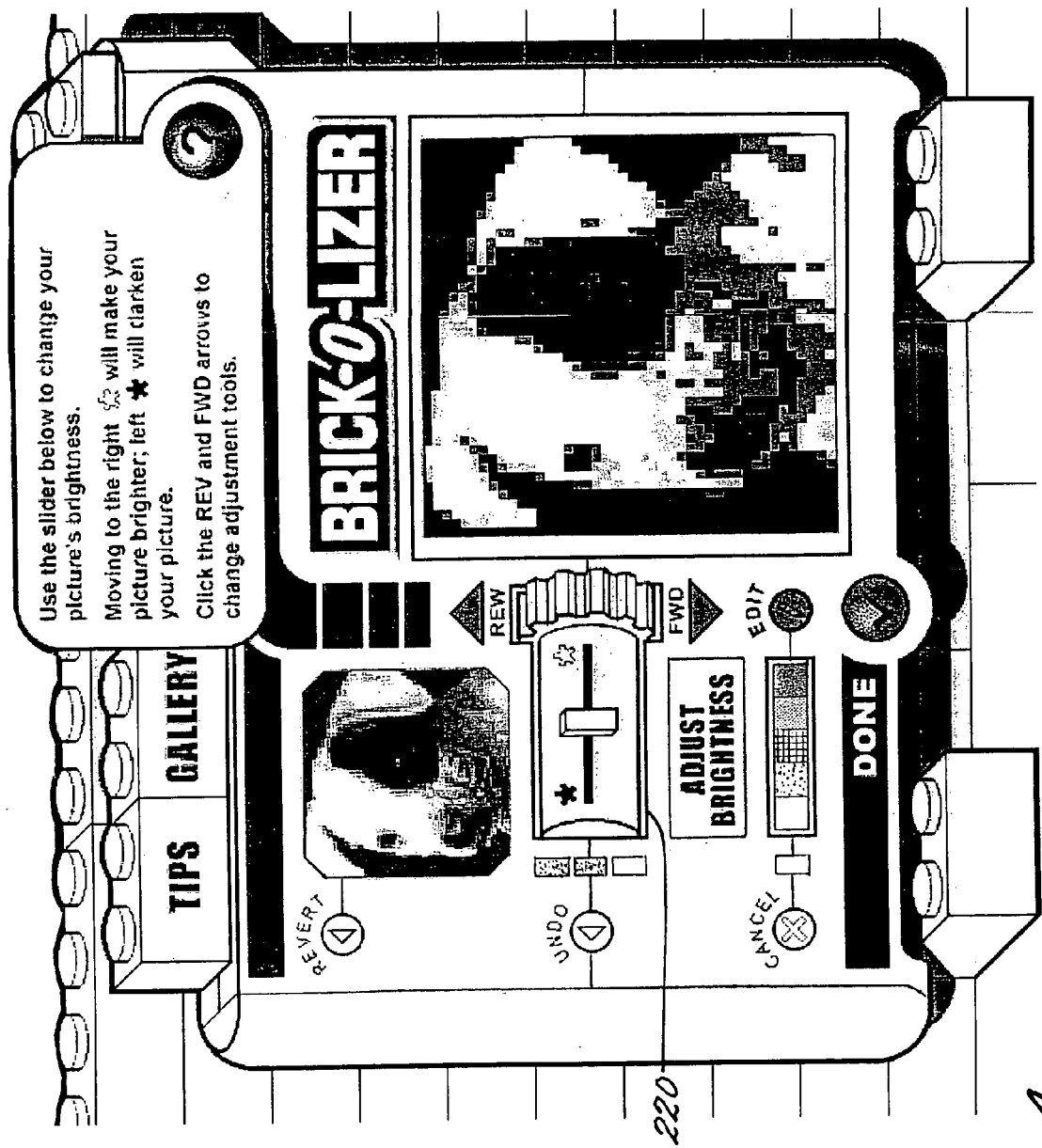

The host system 4 then provides the electronic brick model to the user system 2 over network 6. Alternatively, as described above, the user system 2 can generate the electronic brick model 202 through an applet delivered to the user system 2. FIG. 3 depicts an exemplary user interface provided to user system 2. The user interface includes the image 200 and the electronic brick model 202. In the example shown in FIG. 3, the image is a gray scale image and the electronic brick model includes five types of brick elements, namely, black, dark gray, medium gray, light gray and white. It is understood that the image 200 and electronic brick model 202 may be color images. The brick elements in electronic brick model 202 correspond to physical bricks. In the physical model, the bricks may be arranged in multiple orientations. For example, the bricks can be arranged top up (e.g., stud side up) or side up (e.g. smooth surface side up). The electronic brick model 202 can also be presented in multiple formats including the brick elements in a first orientation (e.g., stud side up) and the brick elements in a second orientation (e.g. smooth surface side up).

Once the electronic brick model 202 is created, the user can edit the image 200 and see the effect on the electronic brick model 202 as shown in step 106. The user interface provides a number of functions selected through an input peripheral (e.g., a mouse) as known in the art. A tool selection icon 203 allows the user to select a number of adjustment tools. An undo button 210 allows the user to undo the effects of a prior change to the image 200. A revert button 212 allows the user to reset the image 200 to the image in an unedited form.

Figure 5:
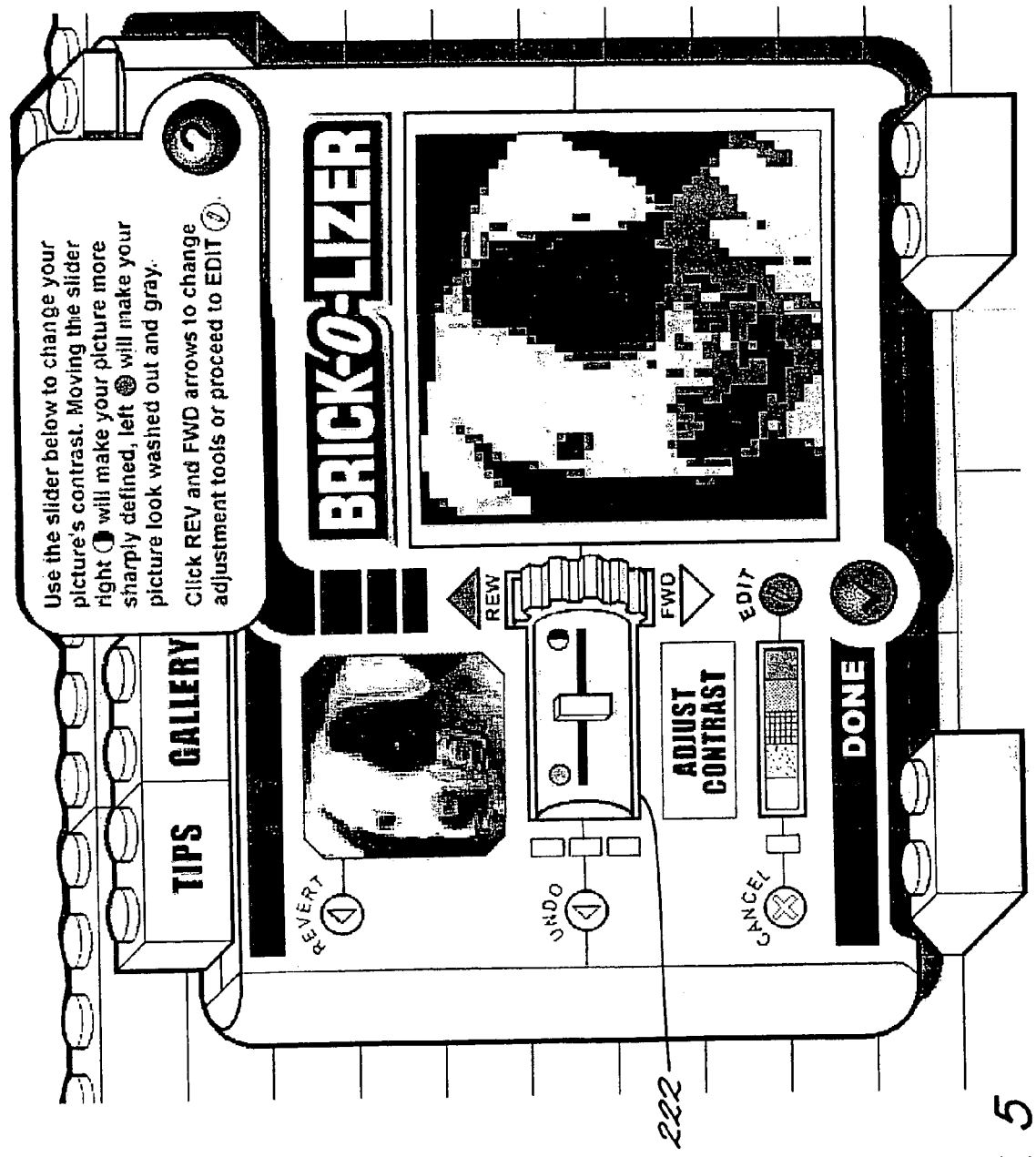

FIG. 3 depicts the picture size adjustment tool. Through a slide bar 216, the user can enlarge or reduce image 200. The user can also reposition the image 200 using an input peripheral. Image 200 is presented in a preview window 218 having a predetermined size. Thus, the user can control what portion of image 200 appears in electronic brick model 202. Another image adjustment tool selected through tool selection icon 203 is a brightness adjustment tool depicted in FIG. 4. The user can increase or decrease the brightness of image 200 through a slide bar 220. This affects the electronic brick model 202 by adjusting display values in the image 200. For example, if the brightness is increased, brick elements in the electronic brick model 202 will be shifted towards lighter tones such as light gray and white. FIG. 5 depicts a contrast adjustment tool selected through tool selection icon 203. The user can increase or decrease the contrast of image 200 through a slide bar 222. This affects the electronic brick model 202 by adjusting values in the image 200. For example, if the contrast is decreased, the difference between the darkest brick elements and brightest brick elements is decreased.

Figure 6:
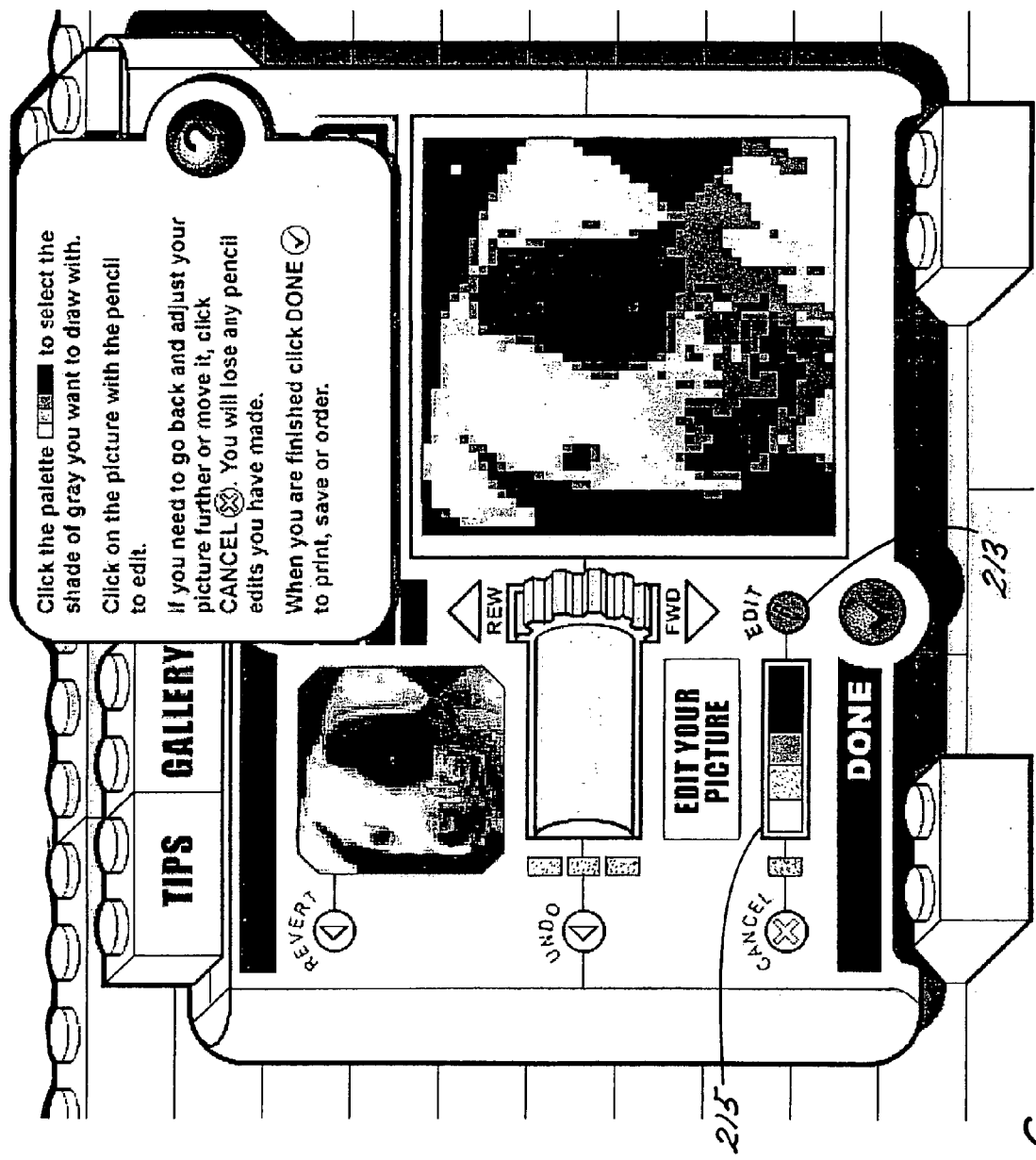

As shown in FIG. 6, edit button 213 allows user to initiate an edit tool. The edit tool allows the user to change the appearance of brick elements in the electronic brick model 202. To change a brick element, the user selects a brick element tone from a brick element tone palette 215 and applies the selected brick element tone to brick elements in electronic brick model 202. It is understood that if the image 200 is a color image, then the tone palette 215 will include colors.

The user may also edit topographical aspects of the electronic brick model 202. For example, the user may use a tool similar to the edit tool shown in FIG. 6 to build layers of bricks upwards from the electronic brick model 202. The user selects a topographical tool and is presented with a palette similar to that shown in FIG. 6. The user could then add or remove layers of brick elements on the electronic brick model 202 by selecting a brick tone and applying the brick elements to the electronic brick model 202. This allows the user to adjust the topography of the electronic brick model 202. Such a tool may be used, for example, to create a facial feature (e.g., a nose) extending from the electronic brick model 202. This feature would then appear in the brick model.

An option available during editing of the image 200 to generate the electronic brick model 202 is adding predefined accessories. The user can select predefined accessories (e.g., hats, glasses, beard, moustache, clothing, etc.), size the predefined accessories, color the predefined accessories, and position the predefined accessories on the electronic brick model 202.

Figure 7:
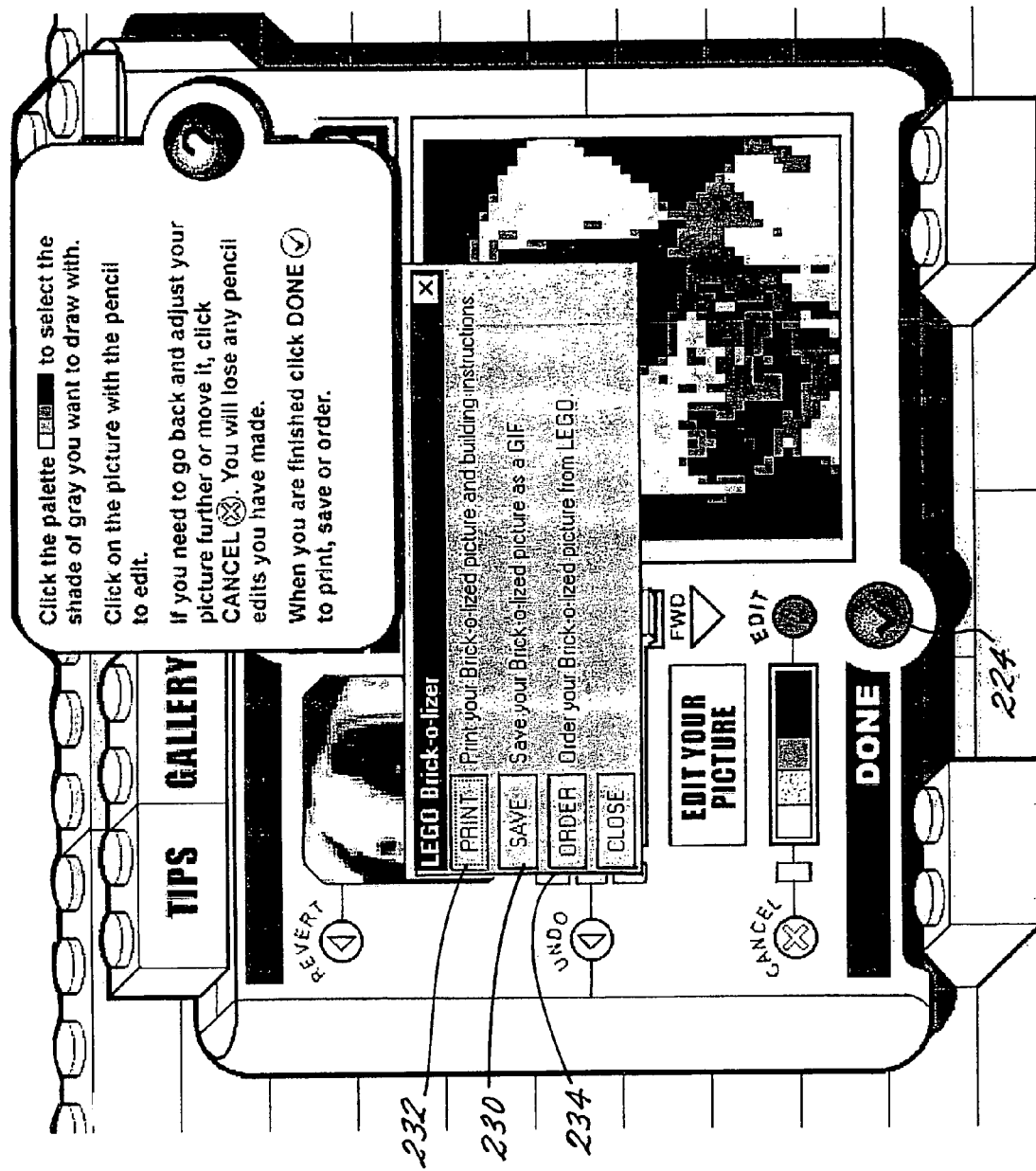

When the user is done editing the image 200, the user may select a done icon 224 which presents the user system 2 with a user interface such as that shown in FIG. 7. Selecting save icon 230 in the user interface of FIG. 7, the user can save the electronic brick model 202 as shown at 108 in FIG. 2. The electronic brick model 202 may be saved in a variety of formats (gif, jpg, bmp, pdf, etc.) on the user system 2 or in the storage device 8.

Figure 8:
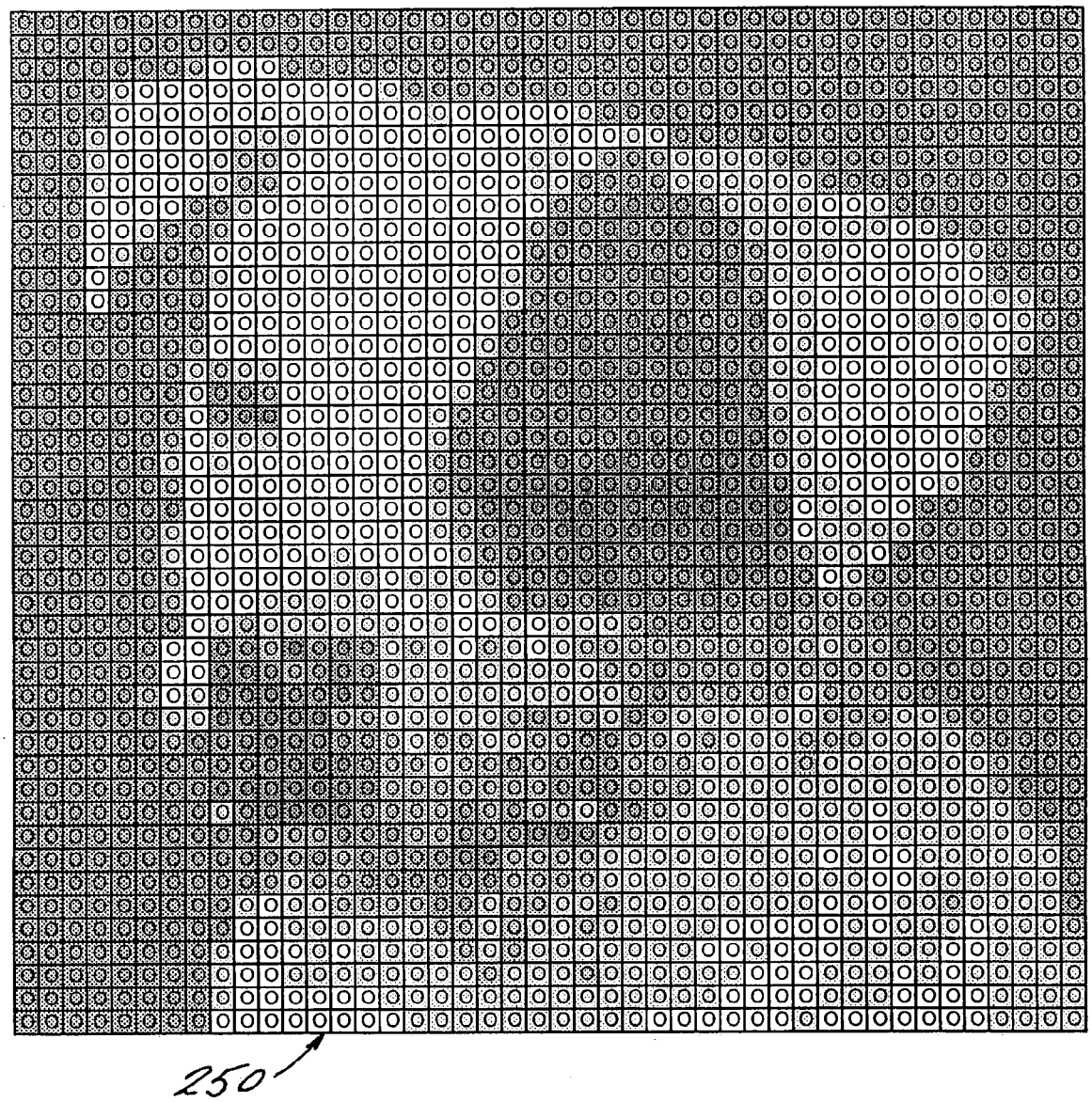
FIG. 8 depicts a printed representation of the electronic brick model.

Selecting the print icon 232 in the user interface of FIG. 7 prints a brick representation of the electronic brick model 202 and building instructions. Selecting the print icon 232 initiates a print function, as indicated in step 110 of FIG. 2, in the user system 2 such as initiating a print routine in a web browser. FIG. 8 depicts an exemplary, printed brick representation 250 of the electronic brick model 202. In the embodiment shown in FIG. 8, the bricks in the printed brick representation 250 are all the same size, corresponding, for example, to a 1×1 brick. The bricks in the printed brick representation 250 may be presented in a first orientation (studs up as shown in FIG. 8) or a second orientation (sides up) depending on user preference.

The host system 4 may also execute a consolidation process in which groups of similarly colored brick elements in the electronic brick model 202 are grouped to form a larger brick element. To group brick elements, a search is performed in the electronic brick model 202 for commonly colored regions corresponding to physical brick sizes. A search may be performed by decreasing brick size. If bricks are available in 1×8, 1×4 and 1×2 sizes, the electronic brick model 202 is searched for commonly colored 1×8 regions, then commonly colored 1×4 regions, then commonly colored 1×4 regions. When a commonly colored region is found that corresponds to a physical brick size, the region is replaced by a larger brick element. For example, four adjacent 1×1 white brick elements may be consolidated into a 1×4 white brick element to correspond to a physical 1×4 brick. Such grouping would appear in the printed brick representation 250. It is understood that the brick elements in the electronic brick model 202 correspond to available physical bricks.

Figure 9:
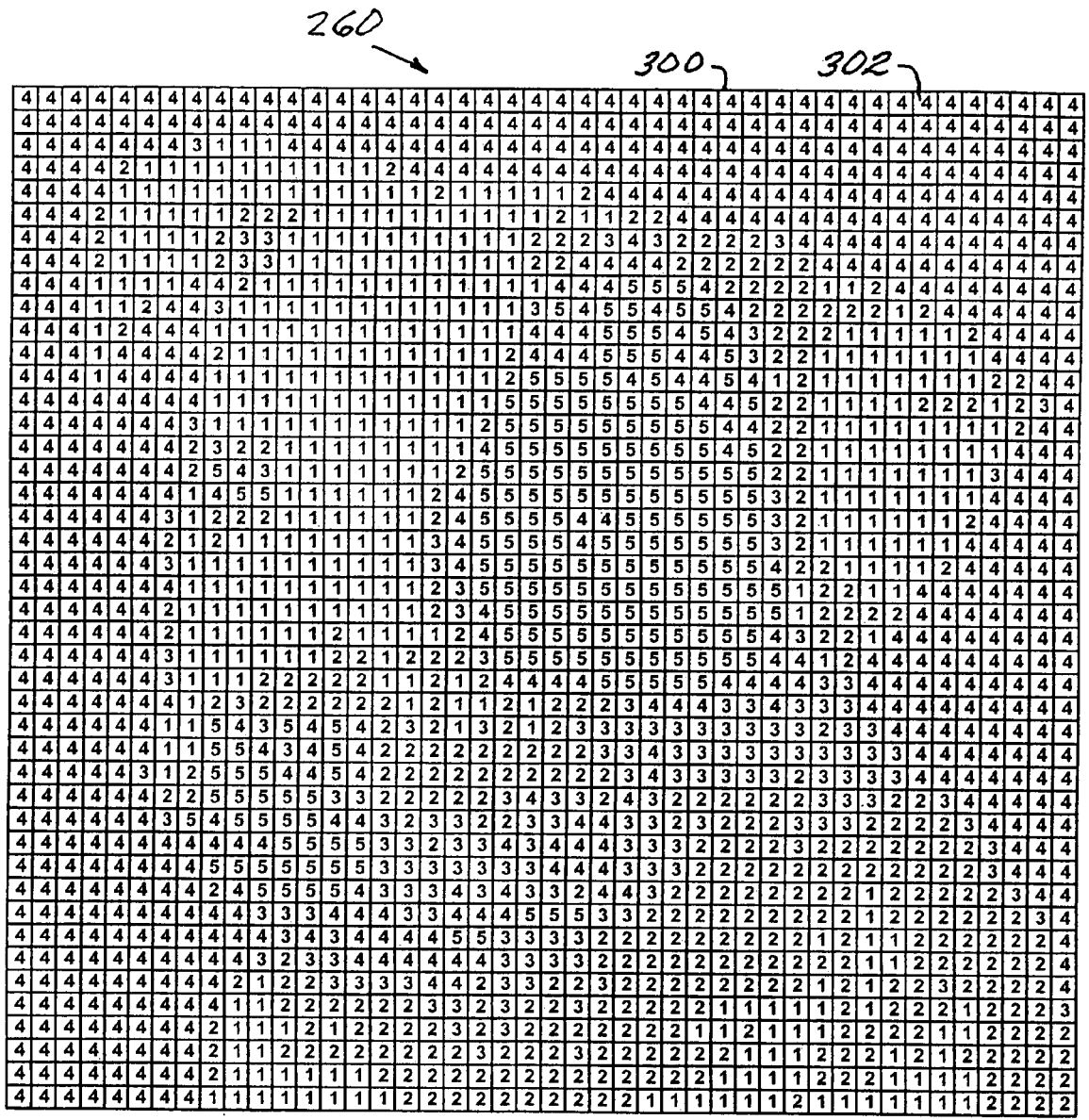
FIG. 9 depicts exemplary building instructions for a brick model.

Selecting print icon 232 also causes the user system 2 to print building instructions such as those shown in FIG. 9. Selecting the print icon 232 initiates a print function, as indicated in step 110 of FIG. 2, in the user system 2 such as initiating a print routine in a web browser. Building instructions 260 are the instructions used for building a model corresponding to the electronic brick model 202. The building instructions 260 include a brick model frame 300 (which corresponds to a physical frame that is sent to the user) and an array of brick indicators 302. Each brick indicator 302 includes indicia (e.g., a number, a letter, a color, etc.) representing the type of brick used in the model. In the embodiment shown in FIG. 9, the brick indicators 302 are all the same size, corresponding, for example, to a 1×1 brick. As described above, the brick indicators may be presented in a first orientation (studs up) or a second orientation (sides up) depending on user preference. As described herein, the host system 4 may also execute a consolidation process in which groups of similarly colored brick elements are grouped. Such grouping would appear in the building instructions 260. A legend 304 includes a key to the indicia provided in the brick indicators 302. A brick count field (not shown) may also be used to display the exact number of bricks needed to build the brick model represented by the building instructions 260.

Selecting order icon 234 in FIG. 7 initiates an order for the brick model represented by the electronic brick model 202 as shown in step 112 of FIG. 2. If not already available, the user system 2 provides a shipping name, shipping address, payment information, etc. to the host system 4 as is known in online ordering systems. If an order is requested, the host system 4 provides the product configuration system 10 with a bill of materials (e.g., brick count for each type of brick) determined from the electronic brick model 202. The host system 4 may also generate an order identifier and provide the order identifier to the product configuration system 10. The product configuration system 10 initiates selection of the appropriate bricks from storage through automated brick selection apparatus (not shown) as shown at step 114. The exact number of bricks may be retrieved from storage or predefined quantities meeting or exceeding the brick counts may be selected. For example, a bag of 50 bricks may be selected if the brick count is 43. Printed material may also be generated for the order by printer 12. The building instructions as shown in FIG. 9 may be submitted to the printer 12 as shown at step 116. In addition, the order identifier, the electronic brick model 202, and additional images may be provided to printer 12. The shipping name and shipping address may also be routed to printer 12 to generate a shipping label. The bricks, building instructions and associated components (e.g., a frame for the brick model) are packaged and provided to the shipping address as shown at step 118.

Figure 11:
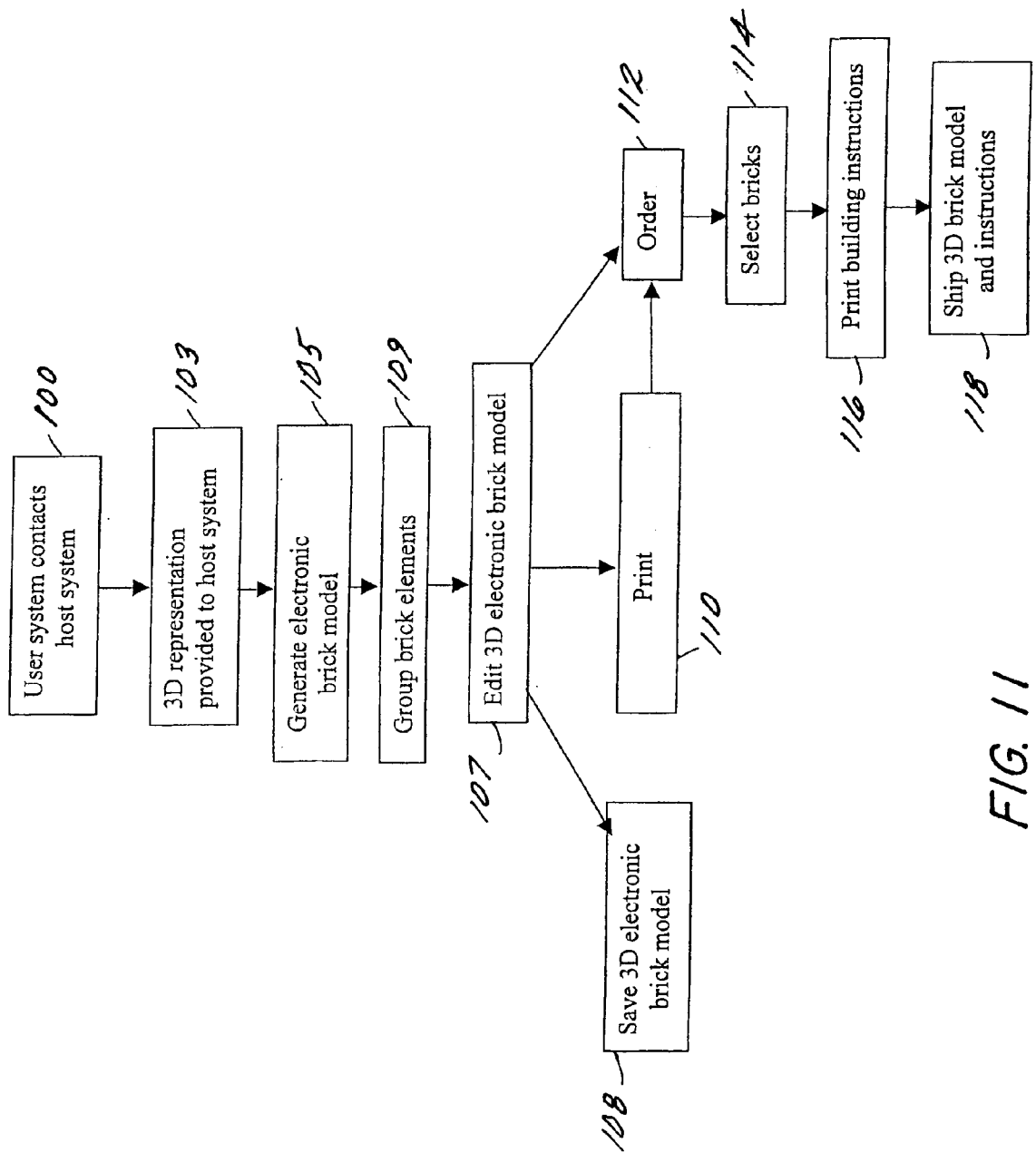
FIG. 11 is a flowchart of an exemplary process for generating a brick model.

The host system 4 can also execute a program to generate a three-dimensional brick model from a three-dimensional representation of an item. FIG. 11 is a flowchart depicting the processing for generating a three-dimensional brick model. Steps similar to those in FIG. 2 are designated with the same reference number in FIG. 11. Step 103 includes submitting a three-dimensional representation of the object to the host system 4. The three-dimensional representation could be in a variety of forms such as a CAD model or a series of two-dimensional images presenting views of the object. At 105, the host system 4 executes a computer program to generate a three-dimensional electronic brick model corresponding to the three-dimensional representation of the object. Initially, the three-dimensional electronic brick model is generated by representing the three-dimensional representation with 1×1×1 brick elements. This involves filling the volume of the three-dimensional representation with 1×1×1 brick elements.

A subsequent step 109 entails grouping individual 1×1×1 brick elements into larger brick elements to provide structural integrity. Often, a three-dimensional brick model made of 1×1×1 bricks will not maintain structural integrity and collapse. Thus, the grouping may be necessary to provide a structurally stable three-dimensional brick model. The grouping may be performed by an individual who has expertise in brick models or by a computer program executed by the host system 4. The following steps are similar to those described in FIG. 2.

As described above, the user system 2 and the host system 4 can share the processing. For example, the user system 2 may include a software application that allows the user system to generate the electronic brick model without assistance from the host system 4. The user system 2 would then contact the host system 4 to upload the electronic brick model to the host system for creation of the brick model. Alternatively, the host system 4 may provide an application to the user system 2 (e.g., an applet) once the user system 2 contacts the host system. Accordingly, processing can be shared by the two systems.

As described above, the present invention can be embodied in the form of computer-implemented processes and apparatuses for practicing those processes. The present invention can also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer (such as host system 4), or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention, but that the invention will include all embodiments falling within the scope of the appended claims.

What is claimed is:

1. A method for generating a brick model, the method comprising:
   receiving an electronic representation of an item to be represented by the brick model; and
   processing said electronic representation to generate building instructions for building the brick model using bricks, said bricks being physical, frictionally interconnecting, three-dimensional, discrete building elements wherein said processing includes:
      generating an electronic brick model including a plurality of brick elements corresponding to bricks based on said electronic representation;
      editing said electronic representation to affect said electronic brick model; and
      generating said instructions for said brick model in response to said electronic brick model.

2. The method of claim 1 wherein said electronic representation is a two-dimensional image.

3. The method of claim 2 wherein:
   said generating said electronic brick model including brick elements corresponding to bricks is based on said two-dimensional image, said two-dimensional image including a plurality of pixels, each of said brick elements representing a combination of pixels.

4. The method of claim 1 wherein said electronic representation is a three-dimensional representation.

5. The method of claim 4 wherein said three-dimensional representation is a CAD model.

6. The method of claim 1 wherein said editing includes at least one of altering brightness, contrast, position, size and color.

7. The method of claim 1 further comprising altering the topography of said electronic brick model.

8. The method of claim 1 further comprising:
   grouping brick elements in said electronic brick model to form a grouped electronic brick model including brick elements corresponding to bricks; and
   generating said instructions for said brick model in response to said grouped electronic brick model.

9. The method of claim 1 further comprising:
   generating a brick count of said bricks based on said electronic brick model.

10. The method of claim 1 wherein:
    said brick model includes at least one layer of bricks.

11. The method of claim 10 wherein:
    said brick model includes a plurality of layers of bricks.

12. The method of claim 1 wherein:
    said brick model comprises monochromatically colored bricks.

13. The method of claim 1 wherein:
    said brick model comprises bricks having multiple colors.

14. The method of claim 1 wherein:
    said building instructions include brick indicators, each brick indicator including an indicia designating a type of brick.

15. The method of claim 14 wherein:
    said indicia is an alphanumeric character.

16. The method of claim 14 wherein:
    said indicia is a color.

17. The method of claim 1 further comprising:
    obtaining a number of bricks to build said brick model at a remote location and transferring said bricks to a user for building said brick model in accordance with said building instructions.

18. The method of claim 17 wherein:
    said number of bricks exceeds the number of bricks needed to build said brick model.

19. The method of claim 1 further comprising:
    adding predefined accessories to said electronic representation of the object.

20. The method of claim 1 wherein said brick model includes toy building elements.

21. A method for generating a brick model, the method comprising:
    receiving an electronic representation of an item to be represented by the brick model; and
    processing said electronic representation to generate building instructions for building the brick model using bricks, said bricks being physical, frictionally interconnecting, three dimensional, discrete building elements wherein said processing includes:
       generating an electronic brick model including a plurality of brick elements corresponding to bricks based on said electronic representation;
       editing said electronic representation to affect said electronic brick model; and
       generating said instructions for said brick model in response to said electronic brick model;
       obtaining a number of bricks to build said brick model at a remote location and transferring said bricks to a user for building said brick model in accordance with said building instructions;
    printing said building instructions and transferring said building instructions to the user.

22. A system for generating a brick model, the system comprising:
- a user system for selecting an electronic representation of an item to be represented by the brick model; and
- a host system coupled to said user system via a network;
- said user system and said host system operating to process said electronic representation to generate building instructions for building the brick model using bricks, said bricks being physical, frictionally interconnecting, three-dimensional, discrete building elements wherein:
  - one of said user system and said host system generates an electronic brick model including a plurality of brick elements corresponding to bricks based on said electronic representation;
  - one of said user system and said host system edits said electronic representation to affect said electronic brick model; and
  - one of said user system and said host system generates said instructions for said brick model in response to said electronic brick model.

23. The system of claim 22 wherein said electronic representation is a two-dimensional image.

24. The system of claim 23 wherein:
one of said user system and said host system generates an electronic brick model including brick elements corresponding to bricks based on said two-dimensional image, said two-dimensional image including a plurality of pixels, each of said brick elements representing a combination of pixels.

25. The system of claim 22 wherein said electronic representation is a three-dimensional representation.

26. The system of claim 25 wherein said three-dimensional representation is a CAD model.

27. The system of claim 22 wherein said editing includes at least one of altering brightness, contrast, position, size and color.

28. The system of claim 22 wherein one of said user system and said host system operate to alter the topography of said electronic brick model.

29. The system of claim 22 wherein:
- one of said user system and said host system groups brick elements in said electric brick model to form a grouped electronic brick model including a plurality of brick elements corresponding to bricks; and
- one of said user system and said host system generates said instructions for said brick model in response to said grouped electronic brick model.

30. The system of claim 22 wherein:
one of said user system and said host system generates a brick count of said bricks based on said electronic brick model.

31. The system of claim 22 wherein:
said brick model includes at least one layer of bricks.

32. The system of claim 22 wherein:
said brick model includes a plurality of layers of bricks.

33. The system of claim 22 wherein:
said brick model comprises monochromatically colored bricks.

34. The system of claim 22 wherein:
said brick model comprises bricks having multiple colors.

35. The system of claim 22 wherein:
said building instructions include brick indicators, each brick indicator including an indicia designating a type of brick.

36. The system of claim 35 wherein:
said indicia is an alphanumeric character.

37. The system of claim 35 wherein:
said indicia is a color.

38. The system of claim 22 wherein:
said host system initiates obtaining a number of bricks to build said brick model at a remote location and transfers said bricks to a user for building said brick model in accordance with said building instructions.

39. The system of claim 38 wherein:
said number of bricks exceeds the number of bricks needed to build said brick model.

40. The system of claim 22 wherein:
one of said user system and said host system adds predefined accessories to said electronic representation of the object.

41. The system of claim 22 wherein said brick model includes toy building elements.

42. A system for generating a brick model, the system comprising:
- a user system for selecting an electronic representation of an item to be represented by the brick model; and
- a host system coupled to said user system via a network;
- said user system and said host system operating to process said electronic representation to generate building instructions for building the brick model using bricks, said bricks being physical, frictionally interconnecting, three-dimensional, discrete building elements wherein:
  - one of said user system and said host system generates an electronic brick model including a plurality of brick elements corresponding to bricks based on said electronic representation;
  - one of said user system and said host system edits said electronic representation to affect said electronic brick model; and
- one of said user system and said host system generates said instructions for said brick model in response to said electronic brick model;
- said host system initiates obtaining a number of bricks to build said brick model at a remote location and transfers said bricks to a user for building said brick model in accordance with said building instructions;
- said host system prints said building instructions and transfers said building instructions to the user.

* * * * *